United States Patent
Suzuki et al.

(10) Patent No.: US 7,138,817 B2
(45) Date of Patent: Nov. 21, 2006

(54) METHOD AND APPARATUS FOR TESTING DEFECTIVE PORTION OF SEMICONDUCTOR DEVICE

(75) Inventors: Junichi Suzuki, Kanagawa (JP); Kohji Kanamori, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 54 days.

(21) Appl. No.: 11/088,833

(22) Filed: Mar. 25, 2005

(65) Prior Publication Data

US 2005/0218922 A1     Oct. 6, 2005

(30) Foreign Application Priority Data

Mar. 31, 2004     (JP)     ............................. 2004-101664

(51) Int. Cl.
 *G01R 31/02* (2006.01)
 *G01R 31/26* (2006.01)
 *H01L 23/58* (2006.01)

(52) U.S. Cl. .................. 324/763; 324/765; 257/48; 438/17; 438/18

(58) Field of Classification Search ...................... None
See application file for complete search history.

(56) References Cited

FOREIGN PATENT DOCUMENTS

JP     2002-110780     4/2002

*Primary Examiner*—Evan Pert
(74) *Attorney, Agent, or Firm*—McGinn IP Law Group, PLLC

(57) ABSTRACT

An apparatus for testing a defect, includes a semiconductor element. In the semiconductor element, a conductive film is formed on an STI (shallow trench isolation) insulating film, which fills a shallow trench extending into a semiconductor region, opposing said semiconductor region through an insulating film in an ordinary state, and the shallow trench is not completely or sufficiently filled with the STI insulating film in a defective state. Also, the apparatus includes a control circuit configured to set a test mode in response to a test mode designation signal, a first voltage applying circuit configured to output a first voltage to the conductive film in the test mode, and a second voltage applying circuit configured to output a second voltage to the semiconductor region in the test mode. The first voltage is higher than the second voltage, and a voltage difference between the first voltage and the second voltage is sufficient to cause breakdown between the conductive film and the semiconductor region in the defective state.

16 Claims, 6 Drawing Sheets

Fig. 4 PRIOR ART

|  | SOURCE (VS) | DRAIN (VD) | CONTROL GATE (VCG) | WELL (VWELL) |
|---|---|---|---|---|
| WRITE | 0 | +0.4 | +9 | 0 |
| READ | 0 | +0.5 | 5 | 0 |
| ERASE | +3~+9 | +3~+9 | −9 | +3~+9 |

Fig. 6

| SIGNAL | NON-OPERATION | ERASE | TEST |
|---|---|---|---|
| A | HV | HV | L |
| B | H | NEG | NEG |
| C | NEG | H | NEG |
| A' | 0 | L | HV |
| B' | H | NEG | NEG |
| C' | NEG | NEG | HV |
| FIRST OUTPUT VOLTAGE | L | HEG | HV |
| SECOND OUTPUT VOLTAGE | L | HV | HEG |

US 7,138,817 B2

METHOD AND APPARATUS FOR TESTING DEFECTIVE PORTION OF SEMICONDUCTOR DEVICE

BACKGROUND OF THE INVENTION

1. Field of the Invention

The present invention relates to an apparatus and method for testing reliability of a trench-type device isolation insulating film of a semiconductor device.

2. Description of the Related Art

In semiconductor devices such as a nonvolatile memory, in which a large number of elements are formed and arrayed on a semiconductor substrate, a trench-type device isolation insulating film, e.g., a shallow trench isolation (STI) film is provided to insulate and isolate the elements from one another. The trench-type device isolation insulating film is formed by forming trenches in a semiconductor substrate to a predetermined depth and by filling the trenches with insulating films. For example, FIG. 3 is a block diagram showing a flash memory with a memory cell array MA in which a large number of memory cells M are arranged in a matrix. The memory cells M arranged in a row direction are connected with a control gate CG as a word line WL extending in the row direction. The memory cells M arranged in a column direction are connected with a bit line BL extending in the column direction. The word lines WL are connected to a word decoder WD, which selects one of the word lines based on a row address. Similarly, the bit lines BL are connected to a bit decoder BD, which selects one of the bit lines based on a column address.

FIGS. 1A and 1B are schematic cross sectional views showing the memory cells M of the flash memory. Specifically, FIG. 1A is a cross sectional view of the memory cells arranged in the row direction, and FIG. 1B is a cross sectional view of the memory cells arranged in the column direction. Trenches 106 are formed in a predetermined pitch in the row direction in the surface portion of a well WELL formed in a semiconductor substrate 101. Drain regions D 109 and source regions S 110 are formed in the surface portion of the well WELL between the trenches 106. In addition, a tunnel oxide film 102 is formed on the surface of the well WELL, and a floating gate film 103 as a floating gate FG is formed on the tunnel oxide film 102. An insulation film 111 is formed to fill the trench 106 in the thickness direction to a middle height of the control gate FG. Thus, a trench-type device isolation insulating films (STI films) 112 are formed for the floating gate CG to be insulated and isolated from each other. Also, a capacitive insulation film 107 is formed on the floating gate FG, and a control gate film 108 for a control gate CG is formed on the capacitive insulation film 107 and serves as a word line WL extending in the row direction.

FIGS. 2A to 2C show a manufacturing method of the STI films and the memory cells. As shown in FIG. 2A, a tunnel oxide film 102, a floating gate film 103, a buffering oxide film 104, and a nitride film 105 serving as polishing stopper film 105 are sequentially formed on a well WELL in the semiconductor substrate 101. Subsequently, these films and the semiconductor substrate 101 are selectively etched, to form the respective trenches 106 of a predetermined depth. Next, as shown in FIG. 2B, an insulating film 111 is deposited to fill the trenches and to cover the nitride film 105. Subsequently, as shown in FIG. 2C, the insulating film 111 is polished by a chemical mechanical polishing (CMP) method by using the nitride film 105 as a stopper, to flatten the surface of the insulating film 111. Then, the nitride film 105 and the oxide film 104 are etched, and the surface of the insulating film 111 is etched. Thus, the insulating film 111 is remains only in the trenches 106, and the STI film is formed. Subsequently, the capacitive insulating film 107 and the control gate film 108 are formed on the STI film in order, and these films are patterned into a predetermined pattern. Subsequently, impurity is ion-implanted to form the drain regions 109 and the source regions 110. Thus, the STI films 112 and the memory cells M shown in FIGS. 1A and 1B are formed. Such an STI film manufacturing method is disclosed in Japanese Laid Open Patent Application (JP-P2002-110780A).

According to the STI film manufacturing method, as shown in FIG. 2B, there is a case that the certain trench 106 is not completely or sufficiently filled with the insulating film 111 due to foreign substance Z. In such a case, a void V is produced in the trench 106 when the insulating film 111 is polished. Consequently, the capacitive insulating film 107 and a part of the control gate film 108 are formed in subsequent steps, to fill the inside of the trench 106, as shown in FIG. 2C. Thus, the control gate film 108 is formed to oppose to the well WELL of the semiconductor substrate 101 through only the thin capacitive insulating film 107. Specifically, the control gate CG is in contact with the well WELL through only the thin capacitive insulating film 107.

By the way, referring to FIGS. 1A and 1B, and 4, a writing operation into the memory cell of the above-described type will be described. In case of the writing operation, a voltage $V_{CG}$ of the control gate CG is set to a positive voltage of about 9 V, and a voltage $V_{WELL}$ of the semiconductor substrate 101 is set to a GND (ground) potential of 0 V. Also, in case of an erasing operation, a negative voltage $V_{CG}$ of about 9 V is applied to the control gate CG, and a positive voltage $V_{WELL}$ lower than +9 V is applied to the well WELL. Therefore, electric field stress of about 9–18 V as a voltage difference between the control gate voltage $V_{CG}$ and the well voltage $V_{WELL}$ is applied to the capacitive insulating film 107. In case of the semiconductor device in which the trench 106 is appropriately filled with the insulating film 111 serving for the STI film 112, the electric field stress is applied through the insulating film 111 and the capacitive insulating film 107 to the STI film 112. In this case, therefore, the STI film 112 has a sufficient endurance. However, in case of the semiconductor device in which the trench 106 is not sufficiently filled with the insulating film 111, as shown in FIG. 2B, there is only the thin capacitive insulating film 107 between the control gate CG and the well WELL. In this case, therefore, deterioration of the capacitive insulating film 107 advances when the electric field stress is repeatedly applied. Finally, electrical leakage or breakdown X occurs between the control gate CG and the well WELL, and causes a memory operation fault.

In order to prevent delivery of a semiconductor device having a possible operation fault, it is preferable to carry out a test where the writing/erasing operations are repeated. However, such a test method requires a long test time. Also, if the number of times of the writing/erasing operations is not appropriate, there is a possibility that a semiconductor device having the possible operation fault may be delivered. In such a case, deterioration of the capacitive insulating film could further advance through a final product test and the actual use of the semiconductor device by an end user, resulting in the semiconductor device being regarded as a defective product. As a result, reliability of the manufacturer side will be lost.

SUMMARY OF THE INVENTION

In an aspect of the present invention, an apparatus for testing a defect, includes a semiconductor element. In the semiconductor element, a conductive film is formed on an STI (shallow trench isolation) insulating film, which fills a shallow trench extending into a semiconductor region, through an insulating film in an ordinary state, and the shallow trench is not completely or sufficiently filled with the STI insulating film in a defective state. Also, the apparatus includes a control circuit configured to set a test mode in response to a test mode designation signal, a first voltage applying circuit configured to output a first voltage to the conductive film in the test mode, and a second voltage applying circuit configured to output a second voltage to the semiconductor region in the test mode. The first voltage is higher than the second voltage, and a voltage difference between the first voltage and the second voltage is sufficient to cause breakdown between the conductive film and the semiconductor region in the defective state.

Here, the first voltage applying circuit may include a first charge pump circuit; and a first selection circuit configured to output the first voltage from the positive charge pump circuit to the conductive film in the test mode. Also, the second voltage applying circuit may include a second charge pump circuit; and a second selection circuit configured to output the second voltage from the second charge pump circuit to the well in the test mode.

In this case, the first selection circuit may include a first P-channel MOS transistor connected between the first charge pump and a first output node; a first N-channel MOS transistor connected between the ground potential and the first output node, through which the first voltage is supplied; and a second N-channel MOS transistor connected between the second charge pump and the first output node. Also, the second selection circuit may include a second P-channel MOS transistor connected between the first charge pump and a second output node, through which the second voltage is supplied; a third N-channel MOS transistor connected between the ground potential and the second output node; and a fourth N-channel MOS transistor connected between the second charge pump and the second output node.

In this case, the control circuit may control gates of the first and second P-channel MOS transistors and the first to fourth N-channel transistors to set the test mode.

Also, the apparatus may further include a memory cell array with a plurality of memory cells arranged in a matrix. The semiconductor element is provided between every two of the plurality of memory cells.

In this case, the memory cell array may be for a flash memory cell array, and each of the plurality of memory cells may include a memory cell transistor that has a control gate as the conductive film In this case, the apparatus may further include an all selection circuit interposed between the memory cell array and the first voltage applying circuit to supply the first voltage to the control gates of the plurality of memory cells in response to an all selection signal.

Also, the memory cell array, the control circuit, the first and second voltage applying circuits may be incorporated in a semiconductor device. Instead, the memory cell array may be incorporated in a semiconductor device, and the control circuit, the first and second voltage applying circuits may be provided outside the semiconductor device.

Also, the first voltage is a positive voltage and the second voltage is a negative voltage.

In another aspect of the present invention, a test method is achieved by providing a semiconductor element, in which a conductive film is formed on an STI (shallow trench isolation) insulating film, which fills a shallow trench extending into a semiconductor region, through an insulating film in an ordinary state, and the shallow trench is not completely or sufficiently filled with the STI insulating film in a defective state; by setting a test mode in response to a test mode designation signal; by applying a first voltage to the conductive film in the test mode; and by applying a second voltage to the semiconductor region in the test mode. Also, when the first voltage is higher than the second voltage, a voltage difference between the first voltage and the second voltage is sufficient to cause breakdown between the conductive film and the semiconductor region in the defective state.

Here, the first voltage may be a positive voltage and the second voltage may be a negative voltage.

Also, the applying a first voltage may include generating the first voltage by a first charge pump circuit, and the applying a second voltage may include generating the second voltage by a second charge pump circuit.

Also, a memory cell array with a plurality of memory cells arranged in a matrix may be provided. At this time, the semiconductor element is provided between every two of the plurality of memory cells. In this case, the memory cell array may be for a flash memory cell array, and each of the plurality of memory cells may include a memory cell transistor that has a control gate as the conductive film Also, the test method may be achieved by further including allowing the first voltage to be applied to the control gates of the plurality of memory cells in response to an all selection signal.

BRIEF DESCRIPTION OF THE DRAWINGS

FIG. 4 is a table showing voltages in case of a writing operation, a reading operation, and an erasing operation to a memory cell;

FIG. 6 is a table showing relation of signals of a control circuit and output voltages of first and second selection circuits.

DESCRIPTION OF THE PREFERRED EMBODIMENTS

Figure 5:
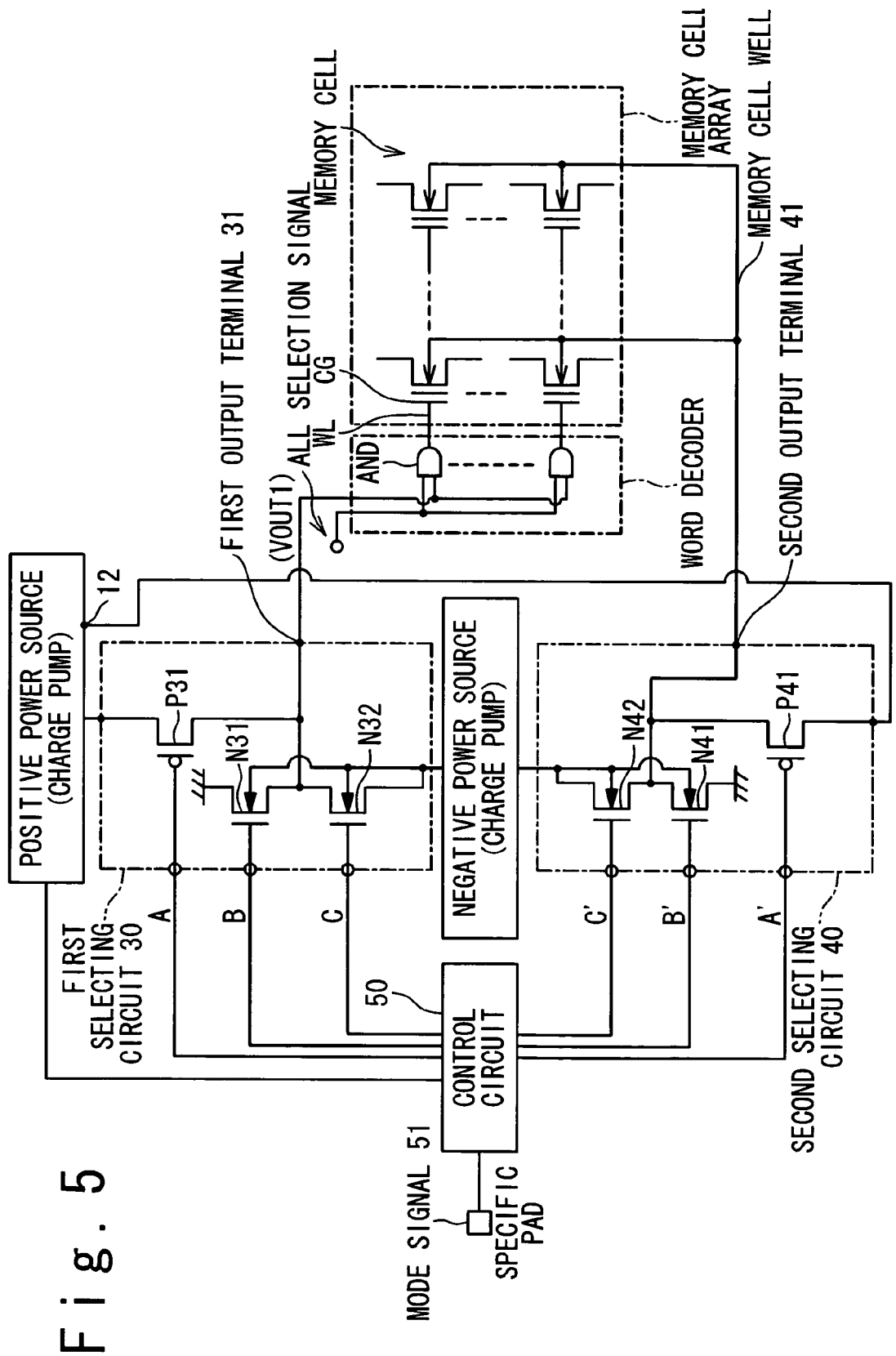
FIG. 5 is a block diagram of a test apparatus of the present invention.

Hereinafter, a test apparatus of the present invention will be described in detail with reference to the attached drawings. FIG. 5 is a block diagram of the test apparatus. In this example, the test apparatus is provided in a semiconductor device containing a flash memory and tests the flash memory. In the present invention, an erasing operation is collectively carried out to all the memory cells M of the memory cell array MA of the flash memory in FIG. 3. Also, the test apparatus includes a positive voltage source, i.e., a positive voltage charge pump 10, which generates a positive voltage of +9 V at a maximum, and a negative voltage source, i.e., or a negative voltage charge pump 20, which generates a negative voltage of −9 V at a minimum. The positive voltage charge pump 10 and the negative voltage charge pump 10 are provided in the existing semiconductor device containing the flash memory. Therefore, the test apparatus can be provided in the semiconductor device. The test apparatus of the present invention further includes a first selection circuit 30 and a second selection circuit 40. The first selection circuit 30 outputs a first output voltage $V_{OUT1}$ from the voltage outputted from the positive voltage charge pump 10. The second selection circuit 40 outputs a second output voltage $V_{OUT2}$ from the voltage outputted from the negative voltage charge pump 20. The apparatus further includes a control circuit 50 for controlling the selection operations of the first and second selection circuits 30 and 40 in response to a mode designation signal externally supplied. The positive voltage charge pump 10 and the first selection circuit 30 constitute a first voltage applying circuit, and the negative voltage charge pump 20 and the second selection circuit 40 constitute a second voltage applying circuit.

Figure 3:
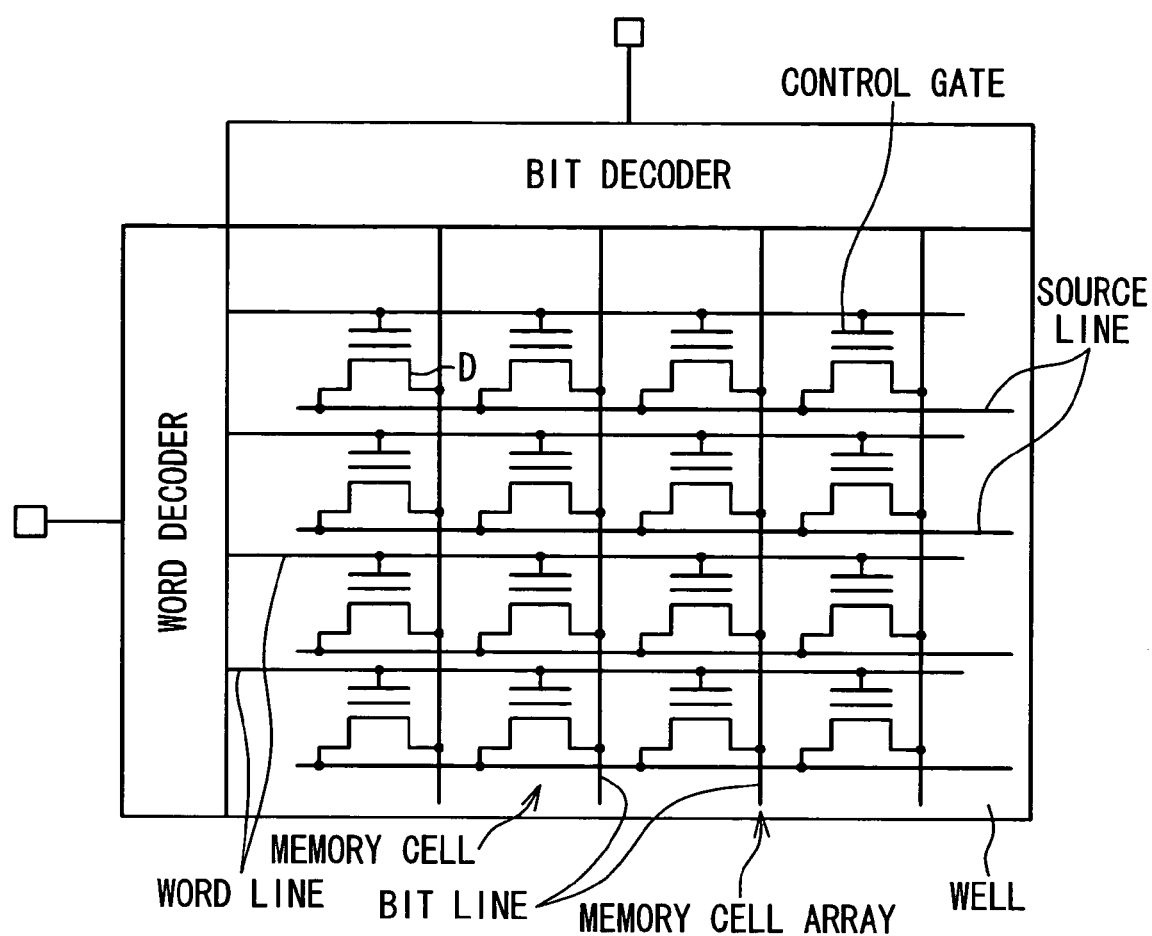
FIG. 3 is a block diagram showing a conventional flash memory.

As is shown in FIG. 3, in the memory cell array MA of the flash memory, the control gates CG of memory cells arranged in the row direction are connected with one of the word lines WL. Also, the plurality of control gates CG arranged in the column direction are selectively applied with a predetermined voltage by the bit decoder BD shown in FIG. 3. The individual word lines WL are connected to the word decoder WD. The word decoder WD includes a plurality of AND gates AND connected with the word lines. Each of the AND gates AND receives an all selection signal and the first output voltage $V_{OUT1}$ from the first selection circuit 30, and outputs the positive voltage based on the all selection signal. The AND gates are connected with the word lines WL, respectively. Thus, when the all selection signal is supplied, the first output voltage $V_{OUT1}$ is commonly applied to all the word lines WL, that is, the control gates CG of all the memory cells M. In addition, a second output voltage $V_{OUT2}$ outputted from a second output terminal 41 of the second selection circuit 40 to the well WELL of the memory cell array MA, that is, the well WELL of a semiconductor substrate 101 on which the memory cells are formed.

The first selection circuit 30 includes a P-channel MOS transistor P31 and two N-channel MOS transistors N31 and N32. The P-channel MOS transistor P31 is connected between a positive voltage terminal 11 of the positive voltage charge pump 10 and the first output terminal 31. The N-channel MOS transistor N31 is connected between the ground (GND) and the first output terminal 31. The N-channel MOS transistor N32 is connected between a negative voltage terminal 21 of the negative voltage charge pump 20 and the first output terminal 31. The control circuit 50 generates control signals A to C in response to a mode designation signal and outputs these control signals to the respective gates of the P-channel MOS transistor P31 and the N-channel MOS transistors N31 and N32, respectively. Similarly, the second selection circuit 40 has a structure similar to the first selection circuit 30. The second selection circuit 40 includes a P-channel MOS transistor P41 and two N-channel MOS transistors N41 and N42. The P-channel MOS transistor P41 is connected between a positive voltage terminal 12 of the positive voltage charge pump 10 and the second output terminal 41. The N-channel MOS transistors N41 is connected between the ground (GND) and the second output terminal 41. The N-channel MOS transistors N42 is connected between a negative voltage terminal 22 of the negative voltage charge pump 20 and the second output terminal 41. The control circuit 50 generates control signals A' to C' in response to the mode designation signal and outputs these control signals to the respective gates of the P-channel MOS transistor P41 and the N-channel MOS transistors N41 and N42, respectively.

Referring again to FIGS. 1A and 1B, the STI film 112 is formed by burying the insulating film 111 such as a silicon oxide film in the respective trenches 106 provided in the well WELL of the semiconductor substrate 101. Also, the memory cell M has a structure in which the tunnel oxide film 102 and the floating gate FG 103 are stacked on the region between the STI film 112 regions between the drain region 109 and the source region 110 provided in the surface of the well WELL. In addition, the capacitive insulating film 107 and the control gate CG 108 as the word line WL are stacked over the plurality of memory cells M and the STI films 112 in the row direction. The first output terminal 31 of the first selection circuit 30 can be commonly connected to the control gates CG through the word decoder WD, and the second output terminal 41 of the second selection circuit 40 is coupled to the well WELL 101.

Although detailed description of an internal configuration of the control circuit 50 is omitted, the control circuit 50 inputs as the mode designation signals, an "erase mode" signal, a "test mode" signal and a "non-operation mode" signal through a specific pad 51 connected to the control circuit 50. The control circuit 50 generates the control signals A to C and A' to C' in response to each of the mode signals, and the control signals A to C are supplied to the first selection circuit 30, and the control signals A' to C' are supplied to the second selection circuit 40. In the first and second selection circuits 30 and 40, the P-channel MOS transistors P31 and P41 and the N-channel MOS transistors N31 and N32 and the two N-channel MOS transistors N41 and N42 are switched in response to the control signals A to C and A' to C'. Thus, the connections to the positive voltage charge pump 10 and the negative voltage charge pump 20 are switched. Accordingly, the first and second output voltages $V_{OUT1}$ and $V_{OUT2}$ outputted to the first and second output terminals 31 and 41 are switched, respectively.

FIG. 6 is a table showing relation of the control signals A to C and A' to C' corresponding to the mode signals generated by the control circuit 50 and the first and second output voltages $V_{OUT1}$ and $V_{OUT2}$ outputted from the first and second selection circuits 30 and 40. In the table, "HV" represents a high voltage of +9 V from the positive voltage charge pump 10, and "NEG" represents a negative voltage of −9 V from the first selection circuit 30. In addition, "H" represents an operating voltage such as 1.8 V, and "L" represents the GND voltage. In the "non-operation mode", the first and second output voltages $V_{OUT1}$ and $V_{OUT2}$ are set to the "L" level voltage, i.e., the GND voltage based on the control signals A to C and A' to C'. In the "erase mode", the first output voltage VOUT1 is set to the "NEG" voltage, i.e., the negative voltage based on the control signals A to C and A' to C', and the second output voltage VOUT2 is set to "HV", i.e., the positive voltage based on the control signals A to C and A' to C'. In the "test mode", the first output voltage VOUT1 is set to the "HV" and the second output voltage VOUT2 is set to the "NEG" based on the control signals A to C and A' to C'.

Although not shown in FIG. 5, predetermined voltages need to be applied to the source region, drain region, control gate, and well in the flash memory to carry out the writing operation, reading operation, and erasing operation to the memory cell M. In this case, voltages different from the first and second output voltages $V_{OUT1}$ and $V_{OUT2}$ should be applied to the source and drain regions. For this purpose, a voltage control circuit is provided to apply the voltages. However, description and illustration of the voltage control circuit are omitted herein, since it does not relates directly to the present invention. To carry out the writing operation, erasing operation, and reading operation on the memory cells, respective voltages $V_S$, $V_D$, $V_C$, $V_{WELL}$ are applied to the source regions, drain regions, control gates, and well, as shown in FIG. 6.

According to the test apparatus as described above, when the control circuit 50 is set the control signals A to C and A' to C' as shown in FIG. 6 when the "non-operation mode" is set, and supplies to the first and second selection circuits 30 and 40, respectively. In the first selection circuit 30, the P-channel MOS transistor P31 and the N-channel MOS transistor N32 are turned OFF, and the N-channel MOS transistor N31 is ON, so that the first output voltage $V_{OUT1}$ is set to "L". Similarly, in the second selection circuit 40, the P-channel MOS transistor P41 and the N-channel MOS transistor N42 are turned OFF, and the N-channel MOS transistor N41 is turned ON, so that the second output voltage $V_{OUT2}$ is set to "L". Accordingly, the word decoder WD does not apply the first output voltage $V_{OUT1}$ to the control gates CG. At this time, the second output voltage $V_{OUT2}$ is applied to the well WELL. On the other hand, the respective voltages shown in FIG. 4 are applied to the source regions, drain regions, control gates, and well. In this manner, the writing operation of data to the memory cells and the reading operation of data from the memory cells can be carried out.

On the other hand, when the control circuit 50 is set to the "erase mode", the control signals A to C and A' to C' are supplied to the first and second selection circuits 30 and 40, respectively, as shown in FIG. 6. In the first selection circuit 30, the P-channel MOS transistor P31 and the N-channel MOS transistor N31 are turned OFF, and the N-channel MOS transistor N32 is turned ON, so that the first output voltage $V_{OUT1}$ is set to "NEG". In the second selection circuit 40, the N-channel MOS transistor N41 and the N-channel MOS transistor N42 are turned OFF, and the P-channel MOS transistor P41 is turned ON, so that the second output voltage $V_{OUT2}$ is set to "HV". Accordingly, the word decoder WD applies the negative voltage of −9 V to the control gates CG of all the memory cells, and applies a positive voltage lower than +9 V to the well WELL, which is common to all the memory cells. Concurrently, same high voltages as that of the well or voltages lower than that of well are applied to the respective source and drain regions, as shown in FIG. 4. In this manner, data in all the memory cells of the flash memory are collectively erased.

Figure 1A:
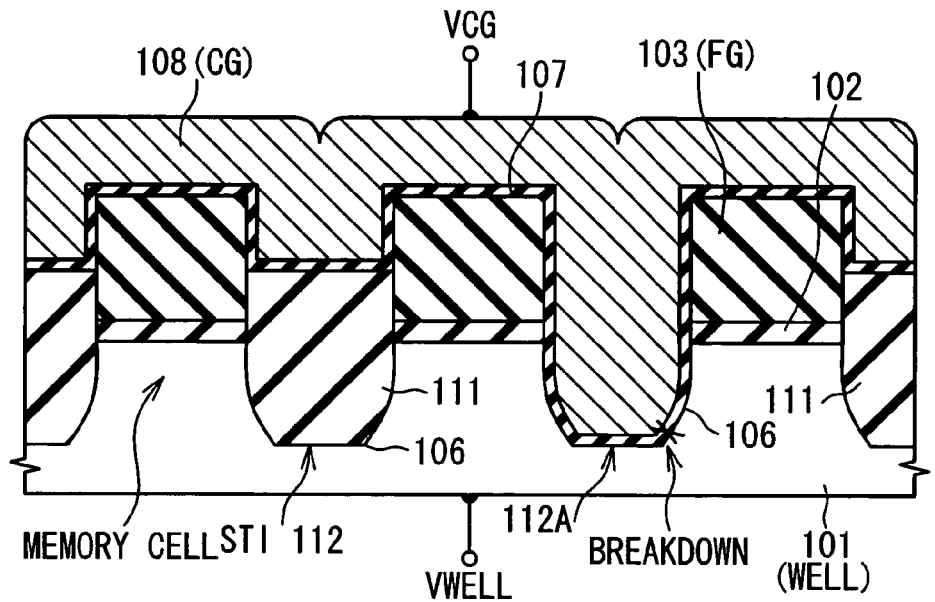
FIGS. 1A and 1B are cross sectional views showing a conventional nonvolatile semiconductor memory.
Figure 1B:
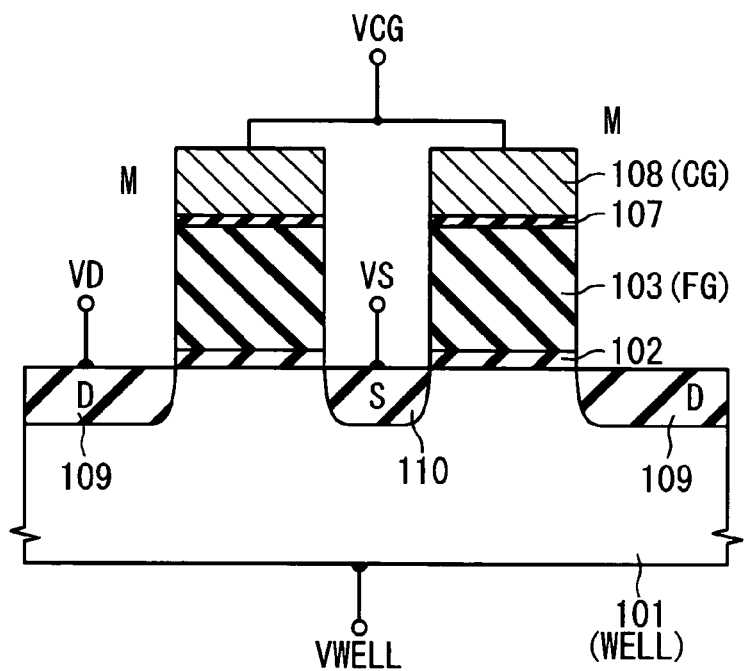
Figure 2A:
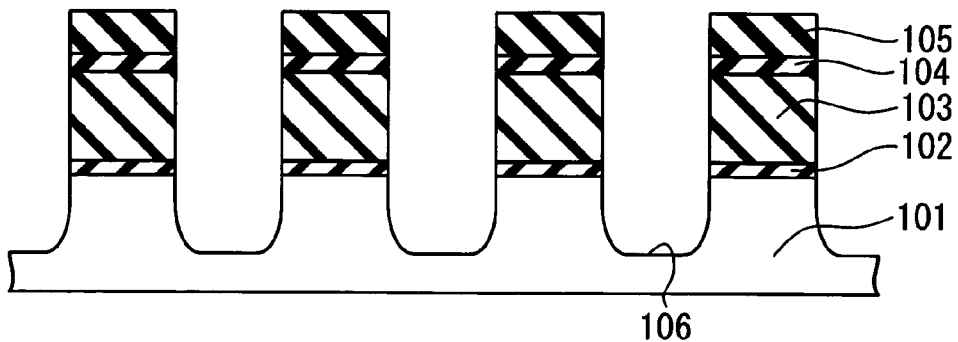
FIGS. 2A to 2C are cross sectional views showing the conventional nonvolatile semiconductor memory device in a conventional manufacturing method.
Figure 2B:
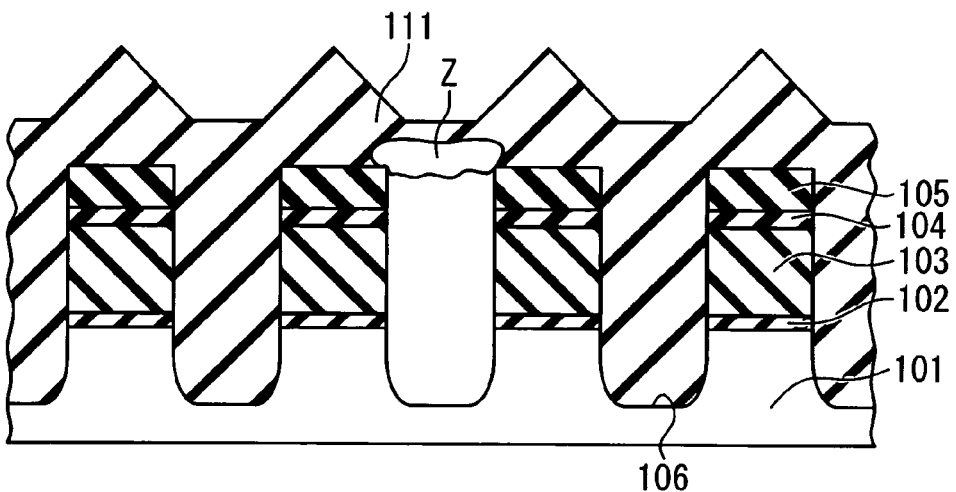
Figure 2C:
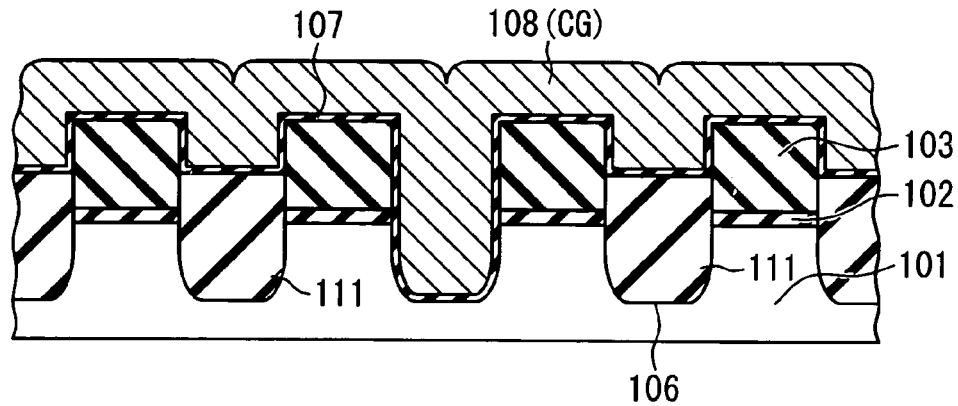

Further, when the control circuit 50 is set to the "test mode", the control signals A to C and A' to C' are supplied to the first and second selection circuits 30 and 40, respectively, as shown in FIG. 6. In the first selection circuit 30, the N-channel MOS transistor N31 and the N-channel MOS transistor N32 are turned OFF, and the P-channel MOS transistor P31 is turned ON, so that the first output voltage $V_{OUT1}$ is set to "HV". In the second selection circuit 40, the P-channel transistor P41 and the N-channel MOS transistor N41 are turned OFF, and the N-channel MOS transistor N42 is turned ON, so that the second output voltage $V_{OUT2}$ is set to "NEG". Accordingly, the word decoder WD applies the positive voltage of +9 V to the control gates CG of all the memory cells. Also, the second selection circuit 40 applies the negative voltage of −9 V to the well WELL, which is common to all the memory cells. This results in application of a voltage difference of 18 V between the control gates CG and the well WELL. This voltage difference is substantially the same as a designed breakdown voltage of the STI film 112. Therefore, if the trench 106 which is not completely or sufficiently filled with the insulating film 111 is present as shown in FIG. 1A, an electric field stress due to the voltage difference of 18 V causes the breakdown X in a portion 112A of the capacitive insulating film 107 since the control gate CG opposes to the well WELL through only the thin capacitive insulating film 107.

After the application of the voltage difference in this way, the erasing or reading operation is carried out on all the memory cells. In this case, the erasing operation may be carried out on all the memory cells or be carried out on the memory cells coupled to the selected control gate. Instead, the reading operation may be carried out on optional memory cells. When the erasing or reading operation is ordinarily carried out, an erase error or a read error is detected in the memory cells coupled to the broken-down control gate, if the breakdown is caused in the portion 112A of the capacitive insulating film 107. Therefore, whether the flash memory is defective can be determined to be defective from detection of the erase error or read error.

In this way, according to the testing method described above, it is possible to previously detect a flash memory that might cause a memory operation fault because of deterioration of the capacitive insulating film due to repetitive application of high voltage electric field stress. Consequently, such a semiconductor device containing such as a flash memory can be prevented from being delivered. Further, according to the testing method, the high voltage is only applied to the control gate and the well, and then an ordinary operation of the semiconductor device is only confirmed. Consequently, the testing can be accomplished very easily and in a reduced testing time.

A case can be contemplated in which a negative voltage is applied to the control gates CG and a positive voltage is applied to the well WELL in the test mode when the high voltage is applied between the control gates CG and the well WELL. In this way, also, the test of the STI film can be accomplished by utilizing high-voltage electric field stresses. In this case, however, charge is drawn off from the floating gate of the memory cell to the well WELL, so that the memory cell goes into the state of depletion, that is, an over-erased state. In such an over-erased state, the NOR type flash memory cannot be returned to an enhancement state for the normal operation. Also, even when the flash memory can be returned to the normal state, a long time is required for the returning operation. Thus, it is not preferable from the viewpoint of the testing in a shorter time. According to the present embodiment, since the high-voltage electric field stress is applied into the so-called charge injection direction, the over-erased state does not occur.

Further, according to the present embodiment, the high voltage opposite in polarity to the erasing operation is applied. However, a higher voltage may be applied to the control gates CG and the well to test a breakdown of the capacitive insulating film 107 in a shorter time. In order to apply such a high voltage, the drive capacities of the positive voltage charge pump 10 and the negative voltage charge pump 20 may be enhanced, compared with the erasing operation and writing operation in the conventional method. An ordinary charger pump has a limiter circuit provided to prevent over-boosted voltage. In this case, the limiter circuit may be invalidated to intentionally generate the over-boosted voltage in the test mode. Alternatively, when a trimming cell are provided to absorb deviation in manufacture, a trimming value to be set by the trimming cells may be set to the maximum level. Still alternatively, the charge pump may be provided with a special boosting circuit that operates only in the test mode.

Thus, in the above embodiment, the charge pumps, which are formed together with the flash memory in the semiconductor device, are used to apply the positive voltage source and the negative voltage source for the high-voltage electric field stress. Also, the first and second selection circuits and the control circuit are formed in the semiconductor device. However, the test apparatus may of course be configured as an external test apparatus. In this case, it is easy to design to apply a voltage higher than in the above-described embodiment between the control gate and the well. Further, insulating film breakdown in an STI film defective portion can be caused in a shorter time. In this way, the testing time can be further reduced.

It should be noted that the present invention is applied to the STI film as the trench-type device isolation insulating film. However, the present invention may be similarly applied to any semiconductor device in which an electrode is formed to extend over the trench-type device isolation insulating film.

What is claimed is:

1. An apparatus for testing a defect, comprising:
  a semiconductor element, in which a conductive film is formed on an STI (shallow trench isolation) insulating film, which fills a shallow trench extending into a semiconductor region, opposing said semiconductor region through an insulating film in an ordinary state, wherein said shallow trench is not completely or sufficiently filled with said STI insulating film in a defective state;
  a control circuit configured to set a test mode in response to a test mode designation signal;
  a first voltage applying circuit configured to output a first voltage to said conductive film in said test mode; and
  a second voltage applying circuit configured to output a second voltage to said semiconductor region in said test mode,
  wherein said first voltage is higher than said second voltage, and a voltage difference between said first voltage and said second voltage is sufficient to cause breakdown between said conductive film and said semiconductor region in the defective state.

2. The apparatus according to claim 1, wherein said first voltage applying circuit comprises:
  a first charge pump circuit; and
  a first selection circuit configured to output said first voltage from said positive charge pump circuit to said conductive film in said test mode, and
  said second voltage applying circuit comprises:
  a second charge pump circuit; and
  a second selection circuit configured to output said second voltage from said second charge pump circuit to said well in said test mode.

3. The apparatus according to claim 2, wherein said first selection circuit comprises:
  a first P-channel MOS transistor connected between said first charge pump and a first output node;
  a first N-channel MOS transistor connected between said ground potential and said first output node, through which said first voltage is supplied; and
  a second N-channel MOS transistor connected between said second charge pump and said first output node, and said second selection circuit comprises:
  a second P-channel MOS transistor connected between said first charge pump and a second output node, through which said second voltage is supplied;
  a third N-channel MOS transistor connected between said ground potential and said second output node; and
  a fourth N-channel MOS transistor connected between said second charge pump and said second output node.

4. The apparatus according to claim 3, wherein said control circuit controls gates of said first and second P-channel MOS transistors and said first to fourth N-channel transistors to set said test mode.

5. The apparatus according to claim 1, further comprising:
  a memory cell array with a plurality of memory cells arranged in a matrix, and
  wherein said semiconductor element is provided between every two of said plurality of memory cells.

6. The apparatus according to claim 5, wherein said memory cell array is for a flash memory cell array, and
  each of said plurality of memory cells comprises a memory cell transistor which has a control gate as said conductive film.

7. The apparatus according to claim 6, further comprising:
  an all selection circuit interposed between said memory cell array and said first voltage applying circuit to supply said first voltage to said control gates of said plurality of memory cells in response to an all selection signal.

8. The apparatus according to claim 7, wherein said memory cell array, said control circuit, said first and second voltage applying circuits are incorporated in a semiconductor device.

9. The apparatus according to claim 7, wherein said memory cell array is incorporated in a semiconductor device, and said control circuit, said first and second voltage applying circuits are provided outside said semiconductor device.

10. The apparatus according to claim 1, wherein said first voltage is a positive voltage and said second voltage is a negative voltage.

11. A test method comprising:
  providing a semiconductor element, in which a conductive film is formed on an STI (shallow trench isolation) insulating film, which fills a shallow trench extending into a semiconductor region, opposing said semiconductor region through an insulating film in an ordinary state, wherein said shallow trench is not completely or sufficiently filled with said STI insulating film in a defective state;
  setting a test mode in response to a test mode designation signal;
  applying a first voltage to said conductive film in said test mode; and
  applying a second voltage to said semiconductor region in said test mode,
  wherein said first voltage is higher than said second voltage, and a voltage difference between said first voltage and said second voltage is sufficient to cause breakdown between said conductive film and said semiconductor region in the defective state.

12. The test method according to claim 11, wherein said first voltage is a positive voltage and said second voltage is a negative voltage.

13. The test method according to claim 11, wherein said applying a first voltage comprises:
  generating said first voltage by a first charge pump circuit, and said applying a second voltage comprises:
generating said second voltage by a second charge pump circuit.

14. The test method according to claim 11, wherein said providing comprises
providing a memory cell array with a plurality of memory cells arranged in a matrix, and
wherein said semiconductor element is provided between every two of said plurality of memory cells.

15. The test method according to claim 14, wherein said memory cell array is for a flash memory cell array, each of said plurality of memory cells comprises a memory cell transistor which has a control gate as said conductive film.

16. The test method according to claim 15, further comprising:
allowing said first voltage to be applied to said control gates of said plurality of memory cells in response to an all selection signal.

* * * * *